United States Patent [19]
Peng

[11] Patent Number: 5,840,203
[45] Date of Patent: Nov. 24, 1998

[54] IN-SITU BAKE STEP IN PLASMA ASH PROCESS TO PREVENT CORROSION

[75] Inventor: Chiang Jen Peng, Hsin-Chu, Taiwan

[73] Assignee: Taiwan Semiconductor Manufacturing Company Ltd., Hsin-Chu, Taiwan

[21] Appl. No.: 755,873

[22] Filed: Dec. 2, 1996

[51] Int. Cl.$^6$ ................................ H01L 21/00
[52] U.S. Cl. ................ 216/66; 430/329; 134/1.1
[58] Field of Search .............. 134/1.1, 1.2, 1.3; 216/64, 66; 430/329; 438/725, 906, 913, 963

[56] References Cited

U.S. PATENT DOCUMENTS

| | | | |
|---|---|---|---|
| 4,281,031 | 7/1981 | Hillman et al. | 427/45.1 |
| 5,174,856 | 12/1992 | Hwang et al. | 156/643 |
| 5,200,031 | 4/1993 | Latchford et al. | 156/659.1 |
| 5,399,236 | 3/1995 | Ha et al. | 156/643 |
| 5,480,748 | 1/1996 | Bakeman, Jr. et al. | 430/11 |

*Primary Examiner*—Bruce Breneman
*Assistant Examiner*—Luz Alejandro
*Attorney, Agent, or Firm*—George O. Saile; Stephen B. Ackerman; Larry J. Prescott

[57] ABSTRACT

The present invention describes a modified dry etching, or plasma ashing, method for removing photoresist residue which avoids corrosion of metal electrodes. The wafers are placed in a batch type plasma chamber and a radio frequency plasma is established while oxygen gas is flowed through the chamber. The radio frequency power is then removed and the wafers, still in the batch type plasma chamber, are baked either with no oxygen flow or with a low oxygen flow rate. The baking drives off chlorine and other ions which can cause metal corrosion. The wafers are then removed from the batch type plasma chamber and normal processing continues.

19 Claims, 4 Drawing Sheets

IN-SITU BAKE STEP IN PLASMA ASH PROCESS TO PREVENT CORROSION

BACKGROUND OF THE INVENTION

(1) Field of the Invention

This invention relates to methods for preventing metal corrosion in integrated circuit wafers and more particularly to a modified plasma ash, or dry etch, process for removing photoresist residue which avoids corrosion of metal electrodes.

(2) Description of the Related Art

When metals are etched to form metal electrode patterns residues from the metal etching step can lead to metal corrosion. It is important to take steps to avoid this potential corrosion.

U.S. Pat. No. 5,399,236 to Ha et al. describes a method of preventing aluminum corrosion by adding alkyl ketone or alkyl ether into an oxygen plasma chamber. The alkyl ketone or alkyl ether react with the aluminum to form an aluminum oxide layer on the surface of the aluminum which protects the aluminum from corrosion.

U.S. Pat. No. 5,480,748 to Bakeman, Jr. et al. describes a method for preventing corrosion through defects in a protective layer formed over metal. A chemical reaction through the defects in the protection layer forms a corrosion resistant film beneath the defects.

U.S. Pat. No. 5,200,031 to Latchford et al. describes a method of removing photoresist which also removes corrosion causing residues from the metal. The method uses a two step plasma process using $NH_3$ and $O_2$.

The present invention describes a method of removing photoresist residue which also removes corrosion causing residues remaining from the metal etch step. The method includes flowing oxygen gas through a plasma chamber with a radio frequency plasma established and maintained to remove the photoresist residues. The radio frequency power is then removed and the wafers are baked without removing them from the plasma chamber to remove the corrosion causing residues and grow a protective layer over the metal.

SUMMARY OF THE INVENTION

A typical process in the fabrication of integrated circuit wafers is to form a layer of metal, such as aluminum, aluminum/copper, or aluminum/copper/silicon over the wafer from which conducting electrodes will be formed. A layer of photoresist is then formed on the layer of metal. The layer of photoresist is selectively exposed and developed to form a photoresist mask. That part of the layer of metal not covered by the photoresist mask is etched away thereby forming the electrode pattern. The photoresist mask is then partially removed using a wet stripper and the final photoresist removal is accomplished with a batch type plasma ash process using a plasma discharge in a batch type chamber while flowing oxygen through the chamber followed by a rinse in deionized water after removing the wafer from the chamber.

A key problem resulting from this method is that residual products of metal etching and photoresist stripping, such as $AlCl_3$ and $Cl_2$, can lead to corrosion of the metal electrodes. This corrosion is responsible for a significant loss of production wafers which must be scrapped because of corrosion damage to the metal electrodes.

It is the principle objective of this invention to provide a batch type plasma ash process for final removal of photoresist residue which will avoid corrosion of metal layers being patterned.

This objective is achieved by inserting an in-situ baking step in the plasma chamber as part of the plasma ash process for removal of the photoresist residue. After the wet stripping of the photoresist the wafers are placed in a batch type plasma chamber. A radio frequency plasma discharge is established with oxygen gas flowing through the plasma chamber. The radio frequency power is then removed and the wafer is baked in the chamber either with no oxygen flow or with oxygen gas flowing at a low flow rate. The baking step drives off the $Cl_2$ based compounds remaining from the metal etching and the wet photoresist stripping which can lead to metal corrosion. Corrosion of the metal electrodes is thereby avoided.

DESCRIPTION OF THE PREFERRED EMBODIMENTS

Figure 1:
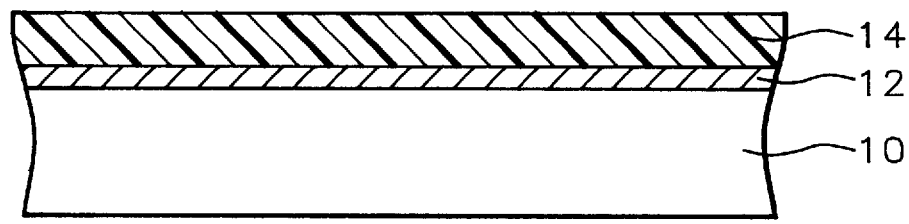
FIG. 1 shows a cross section view of an integrated circuit wafer having a layer of metal and a layer of photoresist formed thereon.

Refer now to FIGS. 1–7, there is shown the preferred embodiments of the batch type plasma ash method of this invention. FIG. 1 shows a cross section view of an integrated circuit wafer 10 having devices formed therein, not shown. A layer of metal 12, such as aluminum, aluminum/copper, or aluminum/copper/silicon, is formed on the integrated circuit wafer 10. There may be a layer of dielectric, not shown, between the wafer 10 and the layer of metal 12. A layer of photoresist 14 is formed on the layer of metal 12.

Figure 2:
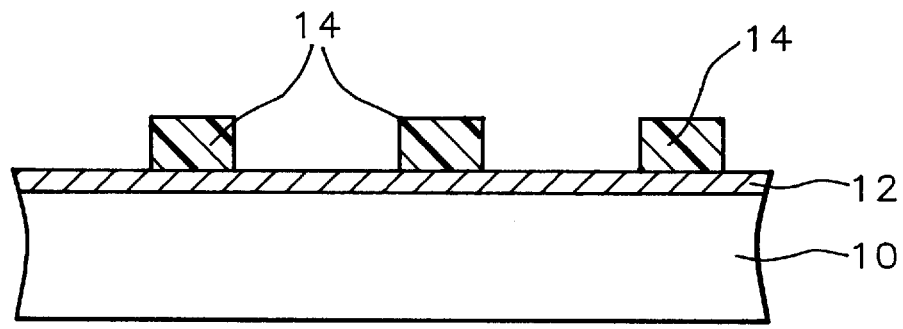
FIG. 2 shows a cross section view of an integrated circuit wafer after the layer of photoresist has been selectively exposed and developed thereby forming a photoresist mask.
Figure 3:
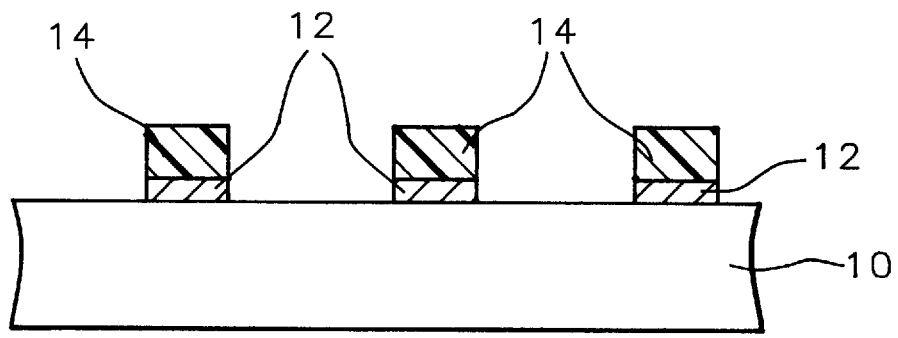
FIG. 3 shows a cross section view of an integrated circuit wafer after that part of the layer of metal not covered by the photoresist mask has been etched away.

As shown in FIG. 2 the layer of photoresist is selectively exposed and developed thereby forming a photoresist mask 14 on the layer of metal 12. Next, as shown in FIG. 3, that part of the layer of metal 12 not covered by the photoresist mask 14 is etched away, using a method such as reactive ion etching or wet etching, thereby forming a metal electrode pattern. The metal etching step frequently uses chlorine based etching and chlorine ions can be left behind on the sidewalls of the metal electrodes. These chlorine ions can cause metal corrosion if they are not removed.

Figure 4:
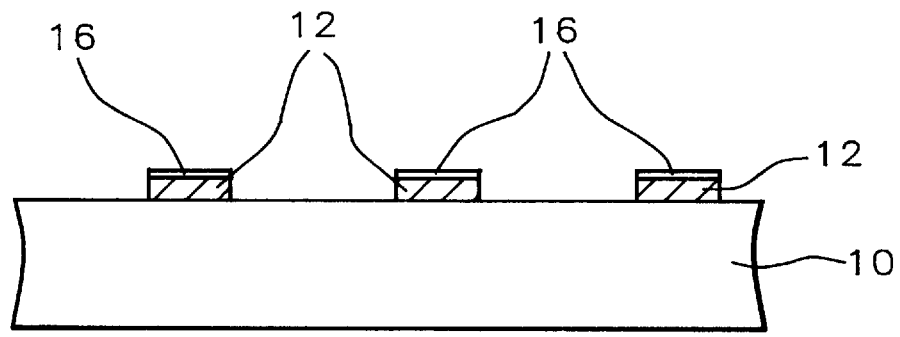
FIG. 4 shows a cross section view of an integrated circuit wafer after a wet stripper has been used to remove the photoresist mask.

Next, as shown in FIG. 4, the photoresist mask is removed using a wet photoresist stripper. The wet stripper removes most of the photoresist, however a photoresist residue 16 remains and must be removed. A batch type dry etching method, commonly referred to as plasma ashing, is used to remove the photoresist residue. This invention provides a modification to the batch type dry etching to remove the chlorine and $AlCl_3$ ions left behind from the metal etching step and avoid metal corrosion.

Figure 5:
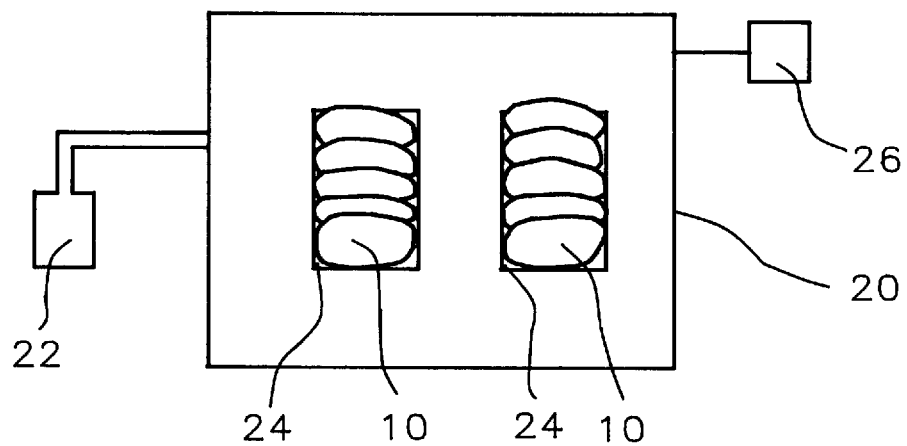
FIG. 5 shows a diagram of a batch type plasma discharge chamber where a plasma ash process is used to remove the photoresist residue after a wet stripper has been used to remove the photoresist mask.

FIG. 5 shows a diagram of a batch type plasma chamber 20 used for the dry etch to remove the photoresist residue. A batch of wafers 10 in wafer holders 24 are placed in the plasma chamber 20. A source of oxygen gas 22 provides means to flow oxygen gas through the plasma chamber 20. A source of radio frequency power 26 provides means to establish and maintain a radio frequency plasma discharge.

Figure 6:
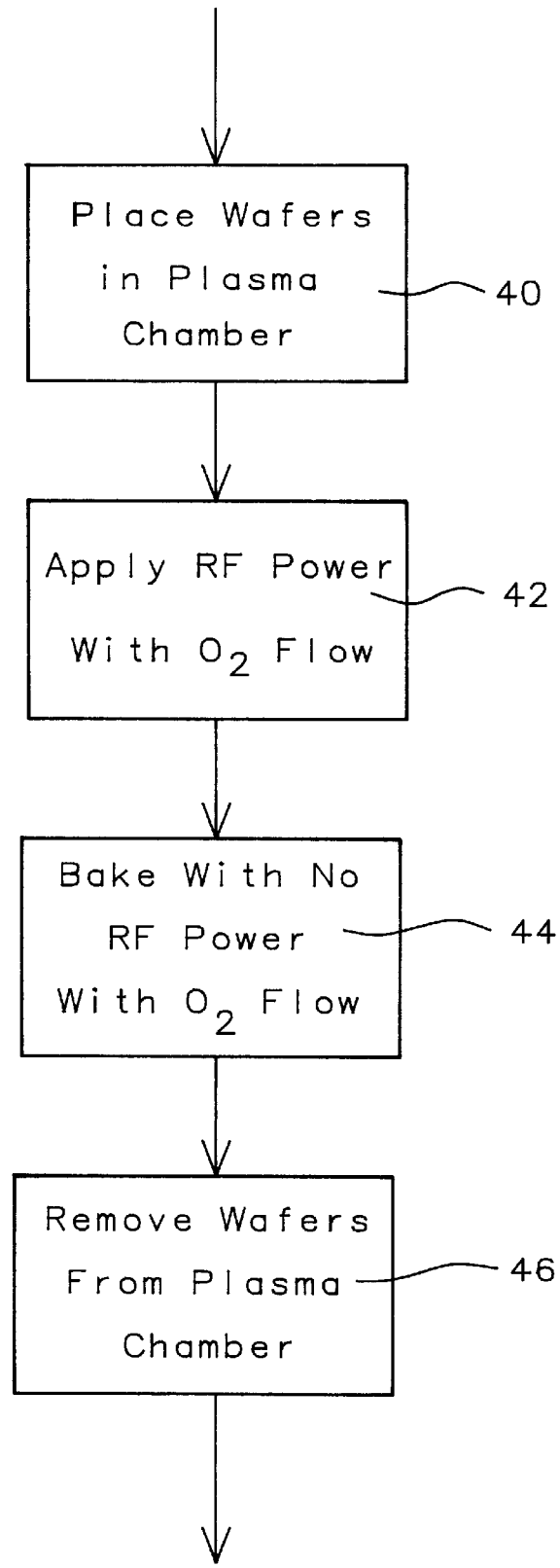
FIG. 6 shows a flow diagram of the batch type plasma ash process with oxygen gas flow of this invention.

FIG. 6 shows a flow diagram of one embodiment of the batch type plasma ash method of this invention used to remove photoresist residue and avoid metal corrosion. As shown in FIG. 6 the wafers are placed in the plasma chamber, flow diagram box 40, after the photoresist has been mostly removed using a wet photoresist stripper. Next, flow diagram box 42, radio frequency power of between about 300 and 800 watts is supplied to the chamber for between about 15 and 100 minutes as oxygen gas is flowed through the chamber at a flow rate of between about 300 and 800 sccm, thereby establishing a radio frequency plasma discharge. This radio frequency plasma discharge removes any remaining photoresist residue.

Next, flow diagram box 44, the radio frequency power is removed and the wafer is heated to a temperature of between about 100° C. and 200° C. for between about 30 and 80 minutes while flowing oxygen gas through the chamber at a flow rate of between about 50 and 100 sccm. This baking step drives the chlorine and $AlCl_3$ from the sidewalls of the metal electrodes and prevents metal corrosion from occurring. Next, flow diagram box 46, the wafers are removed from the plasma chamber and normal wafer processing continues.

Figure 7:
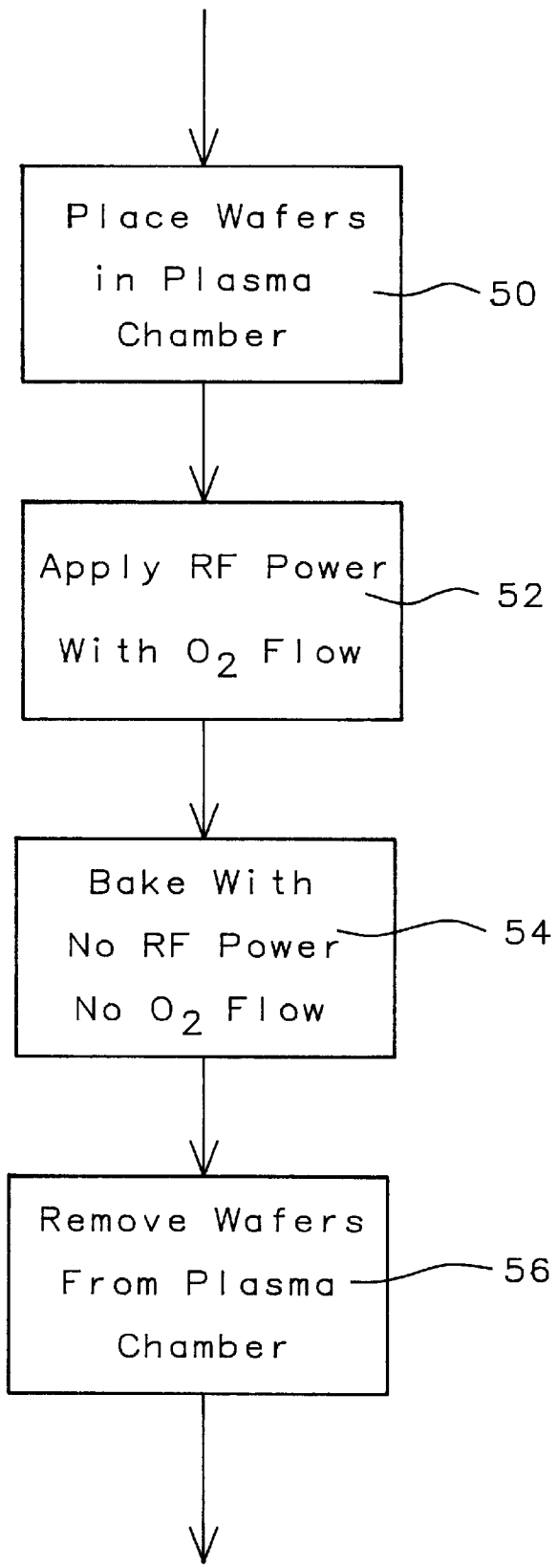
FIG. 7 shows a flow diagram of the batch type plasma ash process without oxygen gas flow of this invention.

FIG. 7 shows a flow diagram of another embodiment of the batch type plasma ash method of this invention used to remove photoresist residue and avoid metal corrosion. As in the preceding embodiment the wafers are placed in the plasma chamber, flow diagram box 50, after the photoresist has been mostly removed using a wet photoresist stripper. Next, flow diagram box 52, radio frequency power of between about 300 and 800 watts is supplied to the chamber for between about 15 and 100 minutes as oxygen gas is flowed through the chamber at a flow rate of between about 300 and 800 sccm, thereby establishing a radio frequency plasma discharge. This radio frequency plasma discharge removes any remaining photoresist residue.

Next, flow diagram box 54, the radio frequency power is removed and the wafer is heated to a temperature of between about 100° C. and 200° C. for between about 30 and 80 minutes with no oxygen gas flow through the chamber. This baking step drives the chlorine and $AlCl_3$ from the sidewalls of the metal electrodes and prevents metal corrosion from occurring. The only difference in this embodiment from the preceding embodiment is that there is no oxygen flow in this embodiment. Next, flow diagram box 56, the wafers are removed from the plasma chamber and normal wafer processing continues.

While the invention has been particularly shown and described with reference to the preferred embodiments thereof, it will be understood by those skilled in the art that various changes in form and details may be made without departing from the spirit and scope of the invention.

What is claimed is:

1. A method of fabricating integrated circuit wafers, comprising:

providing an integrated circuit wafer having devices formed therein;

forming a layer of metal over said integrated circuit wafer;

forming a layer of photoresist over said layer of metal;

selectively exposing said layer of photoresist;

developing said selectively exposed layer of photoresist thereby forming a photoresist mask;

etching away that part of said layer of metal not covered by said photoresist mask;

removing said photoresist mask using a wet photoresist stripper;

placing said wafer in a batch type plasma chamber after removing said photoresist mask;

establishing a radio frequency plasma discharge, having a first radio frequency power, in said batch type plasma chamber for a first time while flowing oxygen gas through said batch type plasma chamber at a first flow rate;

terminating said radio frequency plasma discharge;

heating said wafer in said batch type plasma chamber to a first temperature for a second time while flowing oxygen gas through said batch type plasma chamber at a second flow rate, after terminating said radio frequency plasma discharge, wherein said second flow rate is 100 sccm or less; and removing said wafer from said batch type plasma chamber.

2. The method of claim 1 wherein said first radio frequency power is between about 300 and 800 watts.

3. The method of claim 1 wherein said first time is between about 15 and 100 minutes.

4. The method of claim 1 wherein said first flow rate is between about 300 and 800 sccm.

5. The method of claim 1 wherein said first temperature is between about 100° C. and 150° C.

6. The method of claim 1 wherein said second time is between about 30 and 80 minutes.

7. The method of claim 1 wherein said second flow rate is between about 50 and 100 sccm.

8. The method of claim 1 wherein said layer of metal is a layer of aluminum.

9. The method of claim 1 wherein said layer of metal is a layer of aluminum/copper.

10. The method of claim 1 wherein said layer of metal is a layer of aluminum/copper/silicon.

11. A method of fabricating integrated circuit wafers, comprising:

providing an integrated circuit wafer having devices formed therein;

forming a layer of metal over said integrated circuit wafer;

forming a layer of photoresist over said layer of metal;

selectively exposing said layer of photoresist;

developing said selectively exposed layer of photoresist thereby forming a photoresist mask;

etching away that part of said layer of metal not covered by said photoresist mask;

removing said photoresist mask using a wet photoresist stripper;

placing said wafer in a batch type plasma chamber after removing said photoresist mask;

establishing a radio frequency plasma discharge, having a first radio frequency power, in said batch type plasma chamber for a first time while flowing oxygen gas through said batch type plasma chamber at a first flow rate;

terminating said radio frequency plasma discharge;

heating said wafer in said batch type plasma chamber to a first temperature for a second time without flowing oxygen gas through said batch type plasma chamber, after terminating said radio frequency plasma discharge; and removing said wafer from said batch type plasma chamber.

12. The method of claim 11 wherein said first radio frequency power is between about 300 and 800 watts.

13. The method of claim 11 wherein said first time is between about 15 and 100 minutes.

14. The method of claim 11 wherein said first flow rate is between about 300 and 800 sccm.

15. The method of claim 11 wherein said first temperature is between about 100° C. and 150° C.

16. The method of claim 11 wherein said second time is between about 30 and 80 minutes.

17. The method of claim 11 wherein said layer of metal is a layer of aluminum.

18. The method of claim 11 wherein said layer of metal is a layer of aluminum/copper.

19. The method of claim 11 wherein said layer of metal is a layer of aluminum/copper/silicon.

\* \* \* \* \*